United States Patent
Duffar et al.

(10) Patent No.: US 9,493,889 B2
(45) Date of Patent: Nov. 15, 2016

(54) METHOD FOR THE CRYSTALLOGENESIS OF A MATERIAL ELECTRICALLY CONDUCTING IN THE MOLTEN STATE

(75) Inventors: Thierry Duffar, Grenoble (FR); Gilbert Vian, Saint Martin D'Heres (FR)

(73) Assignees: CENTRE NATIONAL DE LA RECHERCHE SCIENTIFIQUE (CNRS), Paris (FR); INSTITUT POLYTECHNIQUE DE GRENOBLE, Grenoble (FR)

( * ) Notice: Subject to any disclaimer, the term of this patent is extended or adjusted under 35 U.S.C. 154(b) by 1099 days.

(21) Appl. No.: 12/919,934

(22) PCT Filed: Feb. 27, 2009

(86) PCT No.: PCT/EP2009/052393
§ 371 (c)(1),
(2), (4) Date: Aug. 27, 2010

(87) PCT Pub. No.: WO2009/106625
PCT Pub. Date: Sep. 3, 2009

(65) Prior Publication Data
US 2011/0000424 A1 Jan. 6, 2011

(30) Foreign Application Priority Data
Feb. 27, 2008 (FR) ...................................... 08 51259

(51) Int. Cl.
*C30B 11/00* (2006.01)
*C30B 29/40* (2006.01)
*C30B 30/04* (2006.01)

(52) U.S. Cl.
CPC ............ *C30B 11/007* (2013.01); *C30B 11/003* (2013.01); *C30B 29/40* (2013.01); *C30B 30/04* (2013.01); *Y10T 117/1024* (2015.01); *Y10T 117/1092* (2015.01)

(58) Field of Classification Search
USPC .............................................. 117/81, 82, 83
See application file for complete search history.

(56) References Cited

U.S. PATENT DOCUMENTS 3,096,158 A 7/1963 Gauléet al.
5,047,113 A * 9/1991 Ostrogorsky ................... 117/83
(Continued)

FOREIGN PATENT DOCUMENTS

EP 0 338 914 10/1989
EP 0 653 504 5/1995
(Continued)

OTHER PUBLICATIONS

Stelian, Carmen et al.; "Solute Segregation in Directional Solidification of GaInSb Concentrated Alloys Under Alternating Magnetic Fields;" Journal of Crystal Growth, Elsevier, Amsterdam, NL, vol. 266, No. 1-3, XP004505897, May 15, 2004; pp. 207-215.
(Continued)

*Primary Examiner* — Robert M Kunemund
(74) *Attorney, Agent, or Firm* — Harness, Dickey & Pierce, P.L.C.

(57) ABSTRACT

The disclosure relates to a method for the crystallogenesis of a material that is electrically conducting at the molten state, by drawing from a molten mass of the material in a crucible, that comprises: progressively subjecting the molten material to a decreasing temperature so that a liquid-solid interface is formed; controlling the flatness of the liquid-solid interface of the material; subjecting the molten material, before and during solidification, to an electromagnetic kneading; the method including that the electromagnetic kneading is obtained by applying an alternating magnetic field. The disclosure also relates to a device for implementing the method.

16 Claims, 2 Drawing Sheets

(56) References Cited

U.S. PATENT DOCUMENTS

| | | | |
|---|---|---|---|
| 5,879,098 | A | 3/1999 | Delepine et al. |
| 5,932,005 | A | 8/1999 | Duffar et al. |
| 6,090,201 | A | 7/2000 | Duffar et al. |
| 6,554,895 | B2 | 4/2003 | Duffar et al. |
| 6,652,647 | B2 | 11/2003 | Duffar et al. |
| 6,663,711 | B1 | 12/2003 | Wollweber et al. |
| 6,849,121 | B1 | 2/2005 | Iseler et al. |
| 7,465,355 | B2 | 12/2008 | Duffar et al. |
| 2007/0277729 | A1 | 12/2007 | Duffar et al. |

FOREIGN PATENT DOCUMENTS

| | | |
|---|---|---|
| EP | 1 167 586 | 1/2002 |
| FR | 2 865 740 | 8/2005 |
| JP | H06234590 A | 8/1994 |
| WO | WO 97/22806 | 6/1997 |

OTHER PUBLICATIONS

Ma, Nancy et al.; "Vertical Gradient Freezing of Doped Gallium-Antimonide Semiconductor Crystals Using Submerged Heater Growth and Electromagnetic Stirring;" Journal of Crystal Growth, Elsevier, Amsterdam, NL, vol. 259, No. 1-2, XP004464572, Nov. 1, 2003; pp. 26-35.

Ma, Nancy et al.; "Strong-Field Electromagnetic Stirring in the Vertical Gradient Freeze Process With a Submerged Heater;" Journal of Crystal Growth, Elsevier, Amsterdam, NL, vol. 291, No. 1, XP005428308, May 15, 2006; pp. 249-257.

Wang, X. et al.; "A Numerical Investigation of Dopant Segregation by Modified Vertical Gradient Freezing With Moderate Magnetic and Weak Electric Fields;" International Journal of Engineering Science, Oxford, GB, vol. 43, No. 11-12, XP005026028, Jul. 1, 2005; pp. 908-924.

Wang, X. et al.; "Solute Segregation During Modified Vertical Gradient Freezing of Alloyed Compound Semiconductor Crystals With Magnetic and Electric Fields;" International Journal of Heat and Mass Transfer, Pergamon Press, GB, vol. 49, No. 19-20, XP005526671, Sep. 1, 2006; pp. 3429-3438.

Holmes, A.M, et al.; "Vertical Gradient Freezing Using Submerged Heater Growth With Rotation and With Weak Magnetic and Electric Fields;" International Journal of Heat and Fluid Flow, Butterworth Scientific Ltd, Guildford, GB, vol. 26, No. 5, XP005043977, Oct. 1, 2005; pp. 792-800.

\* cited by examiner

METHOD FOR THE CRYSTALLOGENESIS OF A MATERIAL ELECTRICALLY CONDUCTING IN THE MOLTEN STATE

CROSS-REFERENCE TO RELATED APPLICATIONS

This application is a National Phase Entry of International Application No. PCT/EP2009/052393, filed on Feb. 27, 2009, which claims priority to French Application 0851259, filed on Feb. 27, 2008, both of which are incorporated by reference herein.

FIELD OF THE INVENTION

The present invention relates to a method for crystallogenesis of an electrically conducting material in the molten state, i.e. the solidification of the molten material by drawing in a crucible, leading to the formation of a crystal.

BACKGROUND

Segregation of chemical species during the solidification of an alloy is a problem which has been known for a long time. It systematically leads to obtaining materials, the chemical composition of which is heterogeneous, which is a major flaw for materials for which the properties of use are directly related to the chemical composition—such as for example electronic properties of semiconductors, or optical properties of laser or scintillator materials. Further, when elaboration of single-crystal concentrated alloys is desired, changes in composition cause deformations of the crystal which generate crystalline structure defects, which may lead as far as fracture of the sample.

Methods allowing the elaboration of alloys and of much more homogeneous crystals have therefore been the subject of many investigations. In order to characterize the performance of a crystallogenesis method, the benefit lies on the following parameters:
- absence of cracks in the crystal,
- radial homogeneity
- longitudinal homogeneity
- crystallization or drawing rate (expressed in mm/h).

Presently, the most used solidification method in a crucible is the so-called Bridgman drawing technique. According to this technique, with reference to FIG. 1, the alloy to be crystallized is melted in a crucible 1 located in a vertical oven (hatched section), the temperature of which is higher in its upper portion than in its lower portion. Crystallization is performed by slowly moving the crucible 1 downwards. Alternatively, the material may be solidified by gradually lowering the temperature of the oven, the crucible being fixed.

In the case of concentrated alloys, i.e. when the alloy element has a sufficiently high concentration for modifying the melting temperature of the material (which typically corresponds to a concentration above a few percent), this technique has the consequences of strong curvature of the interface between the solid S and the liquid L (illustrated by dashed lines) on the one hand, which generates crystalline defects, sources of cracks, and poor homogeneity of the liquid on the other hand which produces a heterogeneous material both along its radius and its axis. As a first approximation, it is considered that the shape of the interface is parabolic; the curvature is then defined as being the deflection of the interface at the centre of the crucible (i.e. the difference in altitude, on the interface, between the axis and the wall).

Homogeneity is expressed as a percentage of the average concentration: the lower this percentage, the more the material is homogenous. For example, the radial homogeneity of the sample is defined by the ratio:

$$\frac{\text{composition at the centre} - \text{composition at the edge}}{\text{average composition}}$$

Also, the longitudinal homogeneity of the sample is defined by the ratio:

$$\frac{\text{composition at the apex} - \text{composition at the base}}{\text{average composition}}$$

With the standard Bridgman method, the radial homogeneity of the sample is of the order of 100%. The longitudinal heterogeneity is expressed by rapid loss of the crystalline structure of the sample. Optimizations of the Bridgman method with variable displacement velocities of the crucible have been developed (in this matter, reference may be made to the article of Stelian et al., "Growth of concentrated GaInSb alloys with improved chemical homogeneity at low and variable pulling rates", Journal of Crystal Growth 283 (2005) 124-133), but homogeneity and crystalline quality of the material, although improved, are not yet optimum and the growth rates are very low.

Another enhancement to the Bridgman method was then developed which consisted of placing the crucible 1 in an electromagnetic motor 2, as illustrated in FIG. 2. This method is the subject of patent application EP 1 167 586 and of the article of Mitric et al., "Growth of $Ga_{(1-x)}In_xSb$ alloys by Vertical Bridgman technique under alternating magnetic field", Journal of Crystal Growth 287 (2006) 224-229. According to this method, the electromagnetic motor 2 may be a coil with an alternating field or a coil generating a rotating or sliding magnetic field. The magnetic field generates movements in the liquid, which homogenize it efficiently. With this electromagnetic kneading it is therefore possible to obtain much more homogeneous crystals than with the standard technique. The obtained radial homogeneity is of the order of a few tens of percent as described in the article cited above.

However, the liquid-solid interface remains curved—although to a lesser extent than in the standard Bridgman method—and the crystalline quality of the material is not optimum. The obtained sample cracks after a few centimeters of growth. A loss of the crystalline structure is further observed after a few centimeters of growth, which shows longitudinal heterogeneity. Further, this method only operates batchwise, i.e. no new raw material can be added into the crucible during crystallization. Indeed, adding raw material would perturb the flow generated towards the interface.

Other researchers have moreover developed a method consisting of plunging a piston into the crucible. This method, a so-called "AHP" (acronym of Axial Heat flux close to the Phase interface) method, is described in patent application WO 2007/064247. With reference to FIG. 3, the piston 3 is fixed relatively to the oven and therefore does not move down with the crucible 1. The piston is equipped with a thermocouple and a heating resistor, the power of which is controlled so that the temperature of the piston 3 is maintained constant. Under these conditions, the solid-liquid interface remains at a constant distance from the piston 3 and it is much more planar than previously, since it fits the shape of the piston 3.

This technique also has the advantage of being able to operate continuously, since adding new raw material does not perturb the region close to the interface. It therefore seems to be promising industrially. However, the small volume of liquid located between the piston and the interface is practically at rest and is therefore not at all homogenized. The radial homogeneity measured on samples obtained by this technique is of the order of 10%.

Other researchers have moreover studied a method combining a heating piston, the application of an electric field in the molten material and of a continuous magnetic field. In this respect, reference may be made to the article of Nancy Ma et al., "Vertical gradient freezing of doped gallium-antimonide semiconductor crystals using submerged heater growth and electromagnetic stirring", Journal of Crystal Growth 259 (2003) 26-35. However, this is a very cumbersome technique since it requires several amperes of current flowing through the sample (which may be detrimental to the material) and the installation of a big electromagnet around the oven. On the other hand the presented results result from numerical simulations which draw the conclusion of better homogeneity but no experimental result relating to this technique has been published.

For the reasons stated above, no semiconductor alloy is today offered on the market. Now this type of crystals is of greatest technological importance since with a semiconductor alloy, physical parameters intermediate between those of the constitutive materials may be obtained. For example, an alloy comprising 50% silicon and 50% germanium has intermediate electronic properties between those of pure silicon and pure germanium. Moreover, known crystallogenesis methods are relatively slow—typically the most rapid methods have a crystallization rate of the order of 1 mm/h, i.e. the average time for producing a crystal is expressed in days.

One of the goals of the invention is therefore to allow elaboration of crystalline alloys, the composition of which is much more homogenous than with known techniques and which are free of cracks. It is thereby sought to obtain perfect longitudinal homogeneity (i.e. close to 0%) on the major portion of the sample. As regards radial homogeneity, a homogeneity of a few % is targeted. Another object of the invention is to define an industrial method which allows continuous operation and faster crystallization than in the prior art.

SUMMARY

According to the invention, a method for crystallogenesis of an electrically conducting material in the molten state, by drawing from a molten mass of this material in a crucible, wherein:

the molten material is gradually subjected to a decreasing temperature, so that a liquid-solid interface is formed, the flatness of the liquid-solid interface of the material is controlled, the molten material is subjected, before and during solidification, to electromagnetic kneading, said method being characterized in that said electromagnetic kneading is obtained by applying an alternating magnetic field, without causing electric current flow in the material.

In a particularly advantageous way, the control of the flatness of the liquid-solid interface is carried out by maintaining a piston, the temperature of which is controlled at a determined distance from said interface. The temperature of the piston is substantially equal to the sum of the melting temperature of the material and of the product of the thermal gradient in the material by the distance between the interface and the piston. For electromagnetic kneading, an alternating magnetic field is generated, the intensity of which is comprised between 1 and 10 mT and the frequency is comprised between 1,000 and 10,000 Hz.

Another object of the invention relates to a device for crystallogenesis of an electrically conducting material in the molten state, by drawing from a molten mass of this material in a crucible, comprising:

means for cooling the molten material, means for controlling the flatness of the liquid-solid interface of the material, means for generating electromagnetic kneading of the molten material, said device being characterized in that said means for generating electromagnetic kneading comprise means for generating an alternating magnetic field in the material.

The means for controlling the flatness of the interface advantageously comprise:

a piston, the temperature of which controlled, having a planar lower face and means for maintaining the lower face of the piston at a determined distance from the liquid-solid interface of the material.

The means for generating electromagnetic kneading preferably comprise an electromagnetic coil and means for causing flow of an alternating electric current in the coil.

BRIEF DESCRIPTION OF THE DRAWINGS

Other features and advantages of the invention will become apparent from the detailed description which follows, with reference to the appended drawings wherein.

DETAILED DESCRIPTION

The inventors have discovered that by combining both techniques, i.e. simultaneously:

subjecting the molten material contained in the crucible to electromagnetic kneading, and plunging into the molten material a piston maintained at a controlled temperature and at a constant distance from the liquid-solid interface, results are surprisingly obtained which are clearly superior to those expected by simply accumulating the best results of each of these methods.

Figure 1:
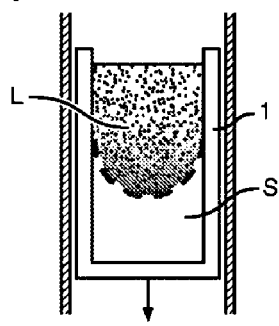
FIG. 1 is a diagram of an installation of the standard Bridgman type.
Figure 2:
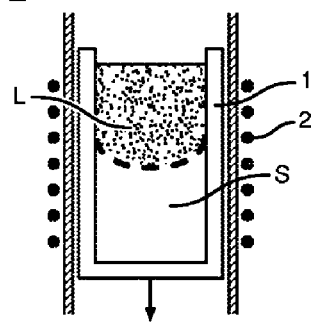
FIG. 2 is a diagram of an enhanced installation of the Bridgman type by means of an electromagnetic motor.
Figure 3:
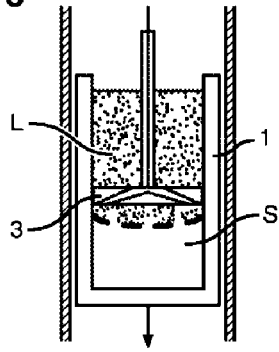
FIG. 3 is a diagram of an installation of the Bridgman type incorporating the piston of the AHP method.
Figure 4:
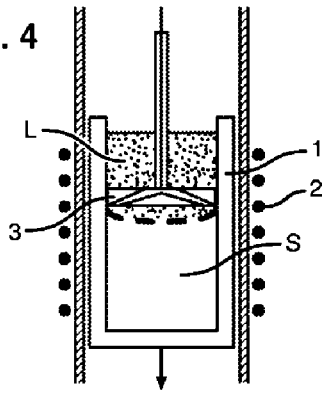
FIG. 4 schematically illustrates an installation according to the invention.

The block diagram of the device is illustrated in FIG. 4.

Description of the Device

Figure 5:
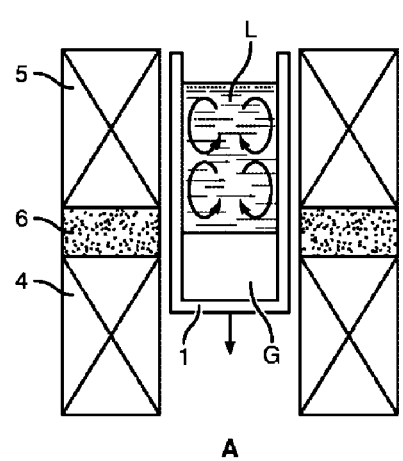
FIG. 5A schematically illustrates the structure of a Bridgman oven.
FIG. 5B illustrates the temperature profile inside the material in the oven of FIG. 5A.
Figure 5:
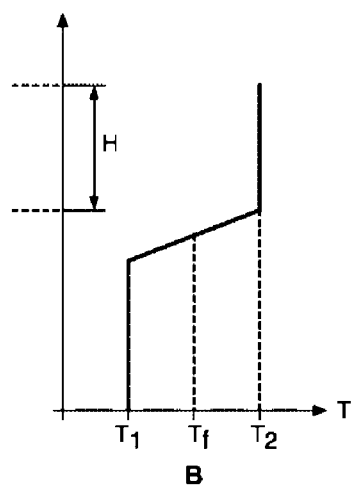

The device comprises a standard Bridgman oven, in which a crucible is translationally mobile, to which are added electromagnetic inductors and a piston, the temperature of which is controlled. FIG. 5 illustrates in its portion A, a cylindrical crucible 1, at the bottom of which a seed G has been placed. Above this seed G is positioned the material from which the intention is to make the single crystal. The crucible 1 is placed in an oven consisting of two heating portions 4 and 5 separated by a thermally insulating area 6 so as to obtain inside the crucible the temperature profile T illustrated in the portion B of FIG. 5.

The temperature profile established during the step for melting the material is centered on the melting temperature Tf of the material. It is the temperature which prevails in the crucible 1 in the portion of the molten mass L which is just in contact with the seed G. The heating portion 4 produces the temperature T1 below the melting temperature of the material. The heating portion 5 produces the temperature T2 which is above the melting temperature of the material. At this stage of the method, the material forms a molten mass L having an upper area, a so-called hot area with height H and of temperature T2 sufficiently away from the melting temperature Tf.

The crucible 1 is in boron nitride. It has a diameter of 11 mm and a depth of more than 90 mm. More generally, one skilled in the art may select any standard material for a crucible, for example graphite or silica for semiconductor materials, noble metals for oxides. Further, any size may potentially be contemplated, being aware that the industrial dimensions are a diameter of the order of 4 inches and a length of several decimeters.

The crucible 1 is translationally mobile inside the oven. The means for displacing the crucible are known to one skilled in the art and will therefore not be described in more detail. According to an alternative of the invention, the crucible is fixed and the oven is gradually cooled while the coil and the piston move upward at the same time as the liquid-solid interface.

The electromagnetic inductors allowing kneading of the liquid may be of any type allowing application of a rotating, sliding or alternating magnetic field. The use of a rotating magnetic field has for example been described in patent application EP 1 167 586. For this purpose an electromagnet is used, such as for example the stator of an electric motor. However, according to a preferred embodiment, an alternating magnetic field will be generated since this solution has the advantage of requiring a much simpler device, i.e. an electromagnetic coil in which an alternating electric current is caused to flow. In this respect, reference may be made to the publication of A. Mitric et al., mentioned above. The electromagnetic coil 2 (illustrated in FIG. 4) appears as a coil consisting of 20 turns of copper wire with a diameter of 1 mm.

The piston 3, the lower face of which is planar, is in graphite. It is fixed relatively to the oven. It is equipped with thermocouples and heating means—for example a heating resistor—capable of controlling its temperature to a determined value depending on the material to be crystallized.

Figure 6:
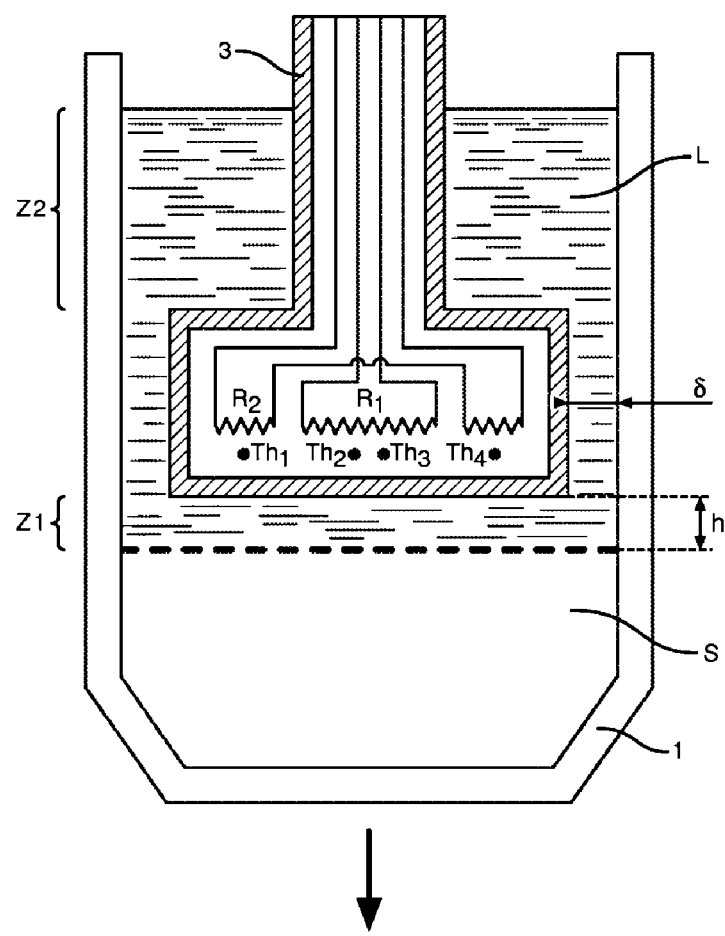
FIG. 6 illustrates a heating piston.

In a complex version, as illustrated in FIG. 6, the piston 3 comprises four thermocouples referenced from Th1 to Th4 and two annular resistors R1 and R2 inside the piston. For this purpose, the piston 3 is hollow and may be disassembled. The wires of the thermocouples and the electric power supply wires of the resistors pass through the tube which holds the piston. The thermocouples are used for regulating the temperature of the heating resistors, to a temperature slightly above the melting temperature of the material. It is possible to impose a radial temperature difference by adjusting the resistors to different values.

However, other simpler configurations of the piston may be contemplated, for example one or two thermocouples and a single resistor. Alternatively, the piston may comprise a single thermocouple which regulates the electric current flowing in the resistor of the oven which surrounds the crucible in order to maintain the piston at a desired temperature. Finally, it is also conceivable not to position any thermocouple in the piston: the temperature of the piston is then controlled by positioning it in the oven at a height at which the temperature is approximately known. The present invention of course covers all these embodiments.

Description of the Method

The application of the method will now be described with reference to the making of a crystal of a concentrated alloy of InGaSb, comprising 80% GaSb and 20% InSb. A seed G with which crystallization may be initiated, is positioned at the bottom of the crucible 1, followed by the raw material which is melted. The temperature of the junction between the seed G and the molten load L is the melting temperature of the material. Upon moving away from the seed, the temperature of the liquid increases by a few degrees to a few tens of degrees per centimeter, thereby defining a thermal gradient expressed in ° C./cm. This thermal gradient is known to one skilled in the art.

The crucible 1 is then moved down into the oven, with a thermal gradient of the order of 40 K/cm and a growth rate of 1 micrometer per second (i.e. 3.6 mm/h). The material gradually cools while crystallizing.

Before and during the solidification, an alternating current of 6 A and of frequency 5,000 Hz is applied to the coil 2, which generates an alternating magnetic field with an intensity of 3 mT. The intensity and the frequency of the magnetic field are calculated by classical equations of electromagnetism. The intensity is calculated by the laws of electromagnetism so as to ensure maximum kneading of the liquid without interfering with the temperature field or the shape or the position of the solid-liquid interface. The frequency is calculated so as to have electromagnetic penetration (skin thickness) of the order of a quarter of the diameter of the sample (internal diameter of the crucible). These quantities are capable of greatly varying from one device to another, notably depending on the diameter of the sample. Typically, the alternating magnetic field has an intensity comprised between 1 and 10 mT and a frequency comprised between 1,000 and 10,000 Hz. The effect of this magnetic field is to generate convection movements inside the molten material which allows its homogenization.

Moreover, the piston 3 is brought to a temperature substantially equal to the sum of the melting temperature and of the product of the aforementioned thermal gradient by the distance which is desired between the piston and the solid-liquid interface. By substantially equal, is understood in this text that the actual temperature of the piston may differ by a few degrees (for example ±10° C.) from the indicated temperature. On the other hand, the temperature of the piston should not fluctuate during the method, otherwise the interface will oscillate.

With reference to FIG. 6, the piston 3 is maintained at a distance h typically comprised between 5 and 10 mm from the liquid-solid interface. The heating piston 3 divides the molten material into two lower Z1 and upper Z2 areas, respectively. These areas are connected through a narrow annular space (the width 8 of which is of the order of 0.5 mm) between the crucible 1 and the piston 3.

When the crucible moves relatively to the piston, the molten material passes from the upper area Z2 (i.e. the area located above the piston) to the lower layer Z1 (i.e. the area located between the solidification interface and the piston). The effect of the piston 3 is to control the liquid-solid interface by keeping it flat.

Experimental Results

The comparative table below may be established for a concentrated alloy InGaSb (comprising 80% Ga and 20% In):

| Parameter | Bridgman method | Electromagnetic kneading | Piston | Piston coupled with kneading (invention) |
|---|---|---|---|---|
| Absence of cracks | Cracked | Cracked after a few cm of growth | Intact | Intact |
| Crystallization rate | 0.4 mm/h | 1 mm/h | 0.4 mm/h | 3.6 mm/h |

It is thus seen that unexpectedly much better results are obtained (notably in terms of the crystallization rate) with the method of the invention than the results which might have been reckoned with by accumulating the better performances of electromagnetic kneading and of the heating piston taken individually.

Possible Applications of the Invention

The invention which has just been described with reference to an alloy InGaSb is by no means limited to this alloy. The invention indeed applies to crystallogenesis of all semiconductor alloys, such as:

binary alloys of germanium and silicon, for applications in micro-electronics;

ternary alloys of the family III-V, i.e. based on antimonides (GaSb, AlSb and InSb), on arsenides (GaAs and InAs) or phosphides (GaP and InP) for applications in fast electronics and optoelectronics;

ternary alloys of the family II-IV, based on tellurides (CdTe, ZnTe, HgTe) or selenides (CdSe or ZnSe), for applications in the field of detectors for the whole range of gamma, X, UV, visible and IR radiations.

The invention may also be applied to the solidification of silicon for photovoltaic applications: indeed with it, it is actually possible to obtain silicon of satisfactory grade from a less pure raw material and therefore available in a larger amount and less expensive. More generally, the invention applies to any type of solidification in a crucible and may therefore relate to metal alloys, glasses, crystals of oxides or halides, subject to that they are conductors of electricity in the molten state.

Finally, it is recalled that the invention is not limited to a device where the piston and the coil are fixed and the crucible is mobile relatively to the oven; the opposite configuration, where the crucible is fixed relatively to the oven, the temperature of which is gradually decreased, is a possible embodiment of the invention. In this case, the coil and the piston are translationally mobile upwards so as to follow the liquid-solid interface.

The invention claimed is:

1. A method for crystallogenesis of an electrically conducting material in the molten state by drawing from a molten mass of this material in a crucible, the method comprising:
    gradually subjecting the molten material to a decreasing temperature, so that a liquid-solid interface is formed;
    controlling flatness of the liquid-solid interface of the material by maintaining a piston, the temperature of which is controlled, at a determined distance from the interface;
    electromagnetically kneading at least the molten material located between the piston and the interface, before and during solidification; and
    applying an alternating magnetic field to obtain the electromagnetic kneading.

2. The method according to claim 1, wherein the temperature of the piston is substantially equal to the sum of the melting temperature of the material and of the product of the thermal gradient in the material by the distance between the interface and the piston.

3. The method according to claim 1, further comprising for electromagnetic kneading, generating an alternating magnetic field, whereof the intensity is comprised between 1 and 10 mT and the frequency is comprised between 1,000 and 10,000 Hz.

4. A device for crystallogenesis of an electrically conducting material in the molten state, by drawing from a molten mass of this material in a crucible, the device comprising:
    a cooler operably cooling the molten material;
    a member operably controlling the flatness of a liquid-solid interface of the material, comprising a piston, the temperature of which is controlled, having a planar lower face configured to be maintained at a predetermined distance from the liquid-solid interface of the material; and
    an electromagnetic kneader of the molten material, the electromagnetic kneader operably generating an alternating magnetic field in at least the material located between the piston and the interface.

5. The device according to claim 4, wherein the electromagnetic kneader further comprises an electromagnetic coil and an alternating electric current operably flowing in the coil.

6. The method of claim 1, wherein the electrically conducting material is selected from:
    binary alloys of germanium and silicon;
    ternary alloys of the III-V family; and
    ternary alloys of the II-IV family.

7. The method of claim 1, wherein the temperature of the piston is set to different values in the radial direction.

8. The method of claim 1, wherein the growth rate of the crystallized material is of 1 micrometer per second.

9. The device of claim 4, wherein the crucible is translationally mobile with respect to the cooler.

10. The device of claim 9, wherein the piston is fixed with respect to the cooler.

11. The device of claim 4, wherein the piston comprises at least one thermocouple arranged therein.

12. The device of claim 11, wherein the piston comprises at least one resistance heater and the at least one thermocouple is operably coupled to the resistance heater so as to regulate the temperature of the resistance heater.

13. A method for crystallogenesis of an electrically conducting material in the molten state by drawing from a molten mass of this material in a crucible, the method comprising:
- positioning a seed at the bottom of a crucible;
- transferring the molten mass to the crucible and forming a junction between the molten mass and the seed, the junction having a temperature of the melting point of the melted material;
- transferring the crucible into an oven with a thermal gradient of about 40 K/cm;
- positioning a piston at a distance of between about 5 mm and about 10 mm from the junction to keep the junction flat, wherein the piston has a temperature that does not fluctuate;
- generating convection movements within the molten mass located between the piston and the junction, wherein said convection movements are generated by an alternating magnetic field with an intensity of between about 1 mT and about 10 mT and a frequency between about 1000 Hz and about 10,000 Hz, the alternating magnetic field being generated by the application of a current to a coil positioned about the crucible; and
- moving the crucible relative to the piston to generate a crystalline alloy at a rate of about 3.6 mm/h, wherein the crystalline alloy is not cracked.

14. The method according to claim 13, wherein the alternating magnetic field has an intensity of about 3 mT.

15. The method according to claim 13, wherein the molten mass includes GaSb and InSb and the crystalline alloy is InGaSb comprising about 80% Ga and about 20% In.

16. A method for crystallogenesis of an electrically conducting material in the molten state by drawing from a molten mass of this material in a crucible, the method comprising:
- positioning a seed at the bottom of a crucible;
- transferring the molten mass to the crucible and forming a junction between the molten mass and the seed, the junction having a temperature of the melting point of the melted material;
- transferring the crucible into an oven with a thermal gradient of about 40 K/cm;
- generating convection movements within the molten mass;
- positioning a piston at a distance of between about 5 mm and about 10 mm from the junction to keep the junction flat, wherein the piston has a temperature that does not fluctuate; and
- moving the crucible relative to the piston to generate a crystalline alloy at a rate of about 3.6 mm/h, wherein the crystalline alloy is not cracked,
- wherein the molten mass includes GaSb and InSb and the crystalline alloy is InGaSb comprising about 80% Ga and about 20% In.

* * * * *